(12) United States Patent  
McMeekin et al.

(10) Patent No.: US 8,792,542 B2  
(45) Date of Patent: Jul. 29, 2014

(54) METHOD AND DEVICE FOR IMPROVED DETECTION AND ANALYSIS OF PARTIAL DISCHARGE ACTIVITY IN AND AROUND HIGH VOLTAGE ELECTRICAL EQUIPMENT

(75) Inventors: Scott McMeekin, Glasgow (GB); Brian G. Stewart, Wishaw (GB); Stephen Conner, Glasgow (GB); Carlos Gamio, Glasgow (GB); Alan Nesbitt, Glasgow (GB)

(73) Assignee: Doble Engineering Company, Watertown, MA (US)

( * ) Notice: Subject to any disclaimer, the term of this patent is extended or adjusted under 35 U.S.C. 154(b) by 309 days.

(21) Appl. No.: 13/258,102

(22) PCT Filed: Mar. 24, 2010

(86) PCT No.: PCT/US2010/028416  
§ 371 (c)(1),  
(2), (4) Date: Dec. 7, 2011

(87) PCT Pub. No.: WO2010/111334  
PCT Pub. Date: Sep. 30, 2010

(65) Prior Publication Data  
US 2012/0077444 A1    Mar. 29, 2012

Related U.S. Application Data

(60) Provisional application No. 61/163,721, filed on Mar. 26, 2009.

(51) Int. Cl.  
*H04B 3/46* (2006.01)

(52) U.S. Cl.  
USPC ........... 375/224; 375/316; 375/340; 375/343; 375/147; 375/146; 375/260; 375/279; 375/365; 375/346

(58) Field of Classification Search  
USPC ......... 375/224, 146, 147, 260, 279, 316, 340, 375/343, 346, 365; 455/67.11  
See application file for complete search history.

(56) References Cited

U.S. PATENT DOCUMENTS

| 5,065,334 | A | 11/1991 | Taylor et al. |
| 5,073,822 | A | 12/1991 | Gumm et al. |

(Continued)

OTHER PUBLICATIONS

PCT/US2010/028416 International Search Report and Written Opinion, 9 pages, May 21, 2010.  
PCT/US2010/028416 International Preliminary Report on Patentability, 8 pages, Feb. 28, 2011.  
Agilent Spectrum Analysis Basics—Application Note 150, Agilent Technologies, Inc, 240 pages, Aug. 2, 2006.

(Continued)

*Primary Examiner* — Dhaval Patel  
(74) *Attorney, Agent, or Firm* — Fish & Richardson P.C.

(57) ABSTRACT

Apparatus for processing broadband impulses signals of low repetition rate includes a tuner for receiving broadband impulsive signals of low repetition rate and providing an output signal characteristic of the amplitude and spectral content of the received input signal. Resolution bandwidth filters coupled to the tuner output each have a different bandwidth that determines the measurement resolution and influences the sensitivity and transient response to low repetition rate impulsive signals. At least one radio frequency switch selects a resolution bandwidth filter for coupling to and associated one of at least a peak detector, an average detector and an envelope generator. A gate generator coupled to the peak detector, the average detector and the envelope generator furnishes a gating signal to each to provide a peak signal, an average signal and an envelope signal respectively during a selected gating interval. A microprocessor is coupled to the peak detector and the average detector.

8 Claims, 6 Drawing Sheets

(56) References Cited

U.S. PATENT DOCUMENTS

| | | |
|---|---|---|
| 5,416,798 A | 5/1995 | Hirose et al. |
| 6,088,205 A * | 7/2000 | Neiger et al. ............ 361/42 |
| 6,130,540 A * | 10/2000 | Achatz ................ 324/536 |
| 2009/0045798 A1 | 2/2009 | Heah et al. |

* cited by examiner

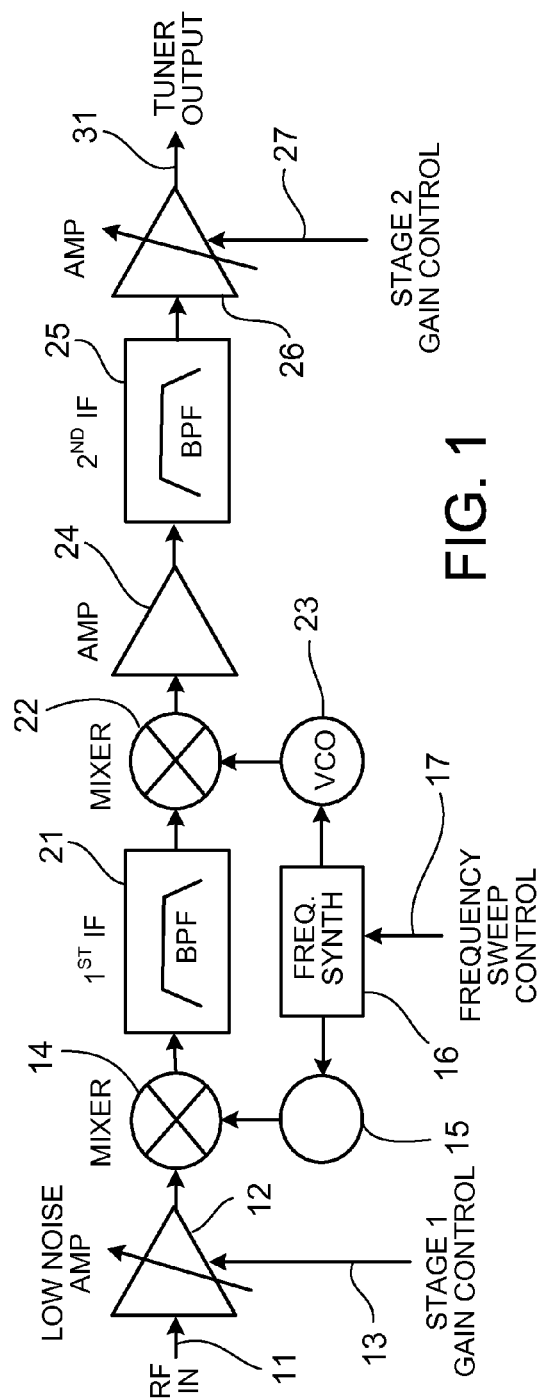
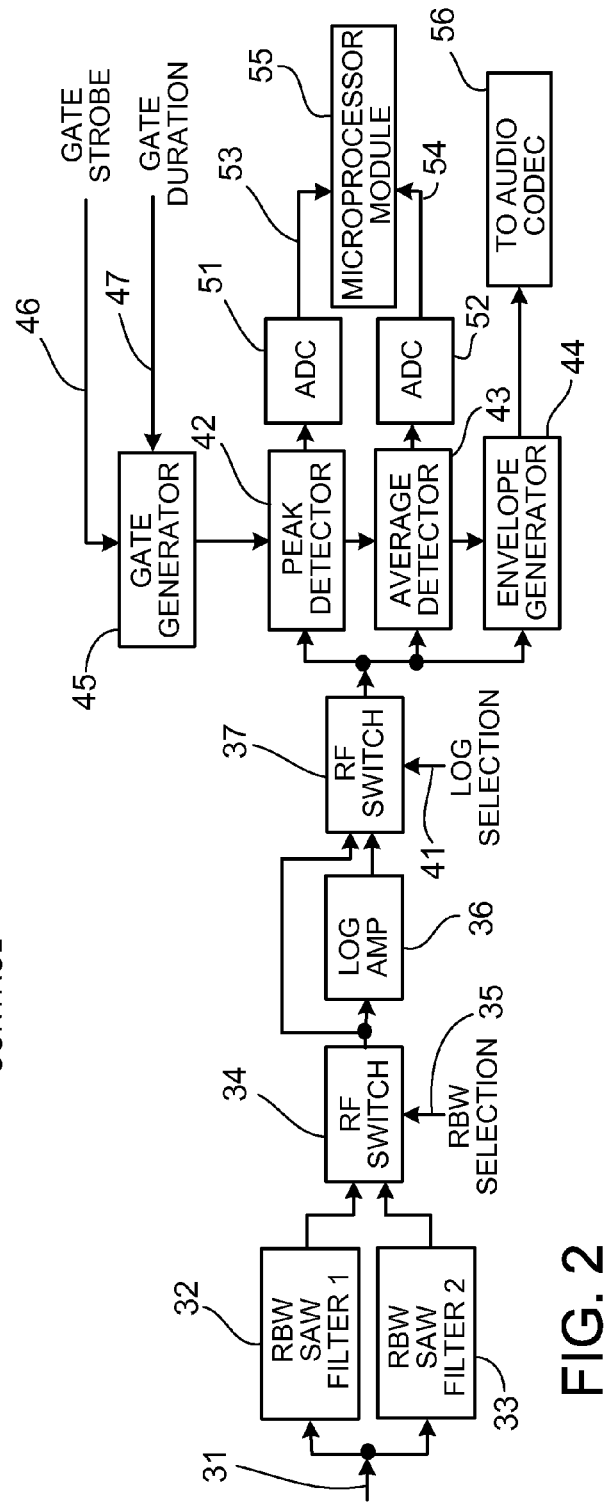

TYPICAL TIME RESOLVED MODE TRACES

TYPICAL PEAK MINUS AVERAGE MEASUREMENT FROM A REAL DEFECT

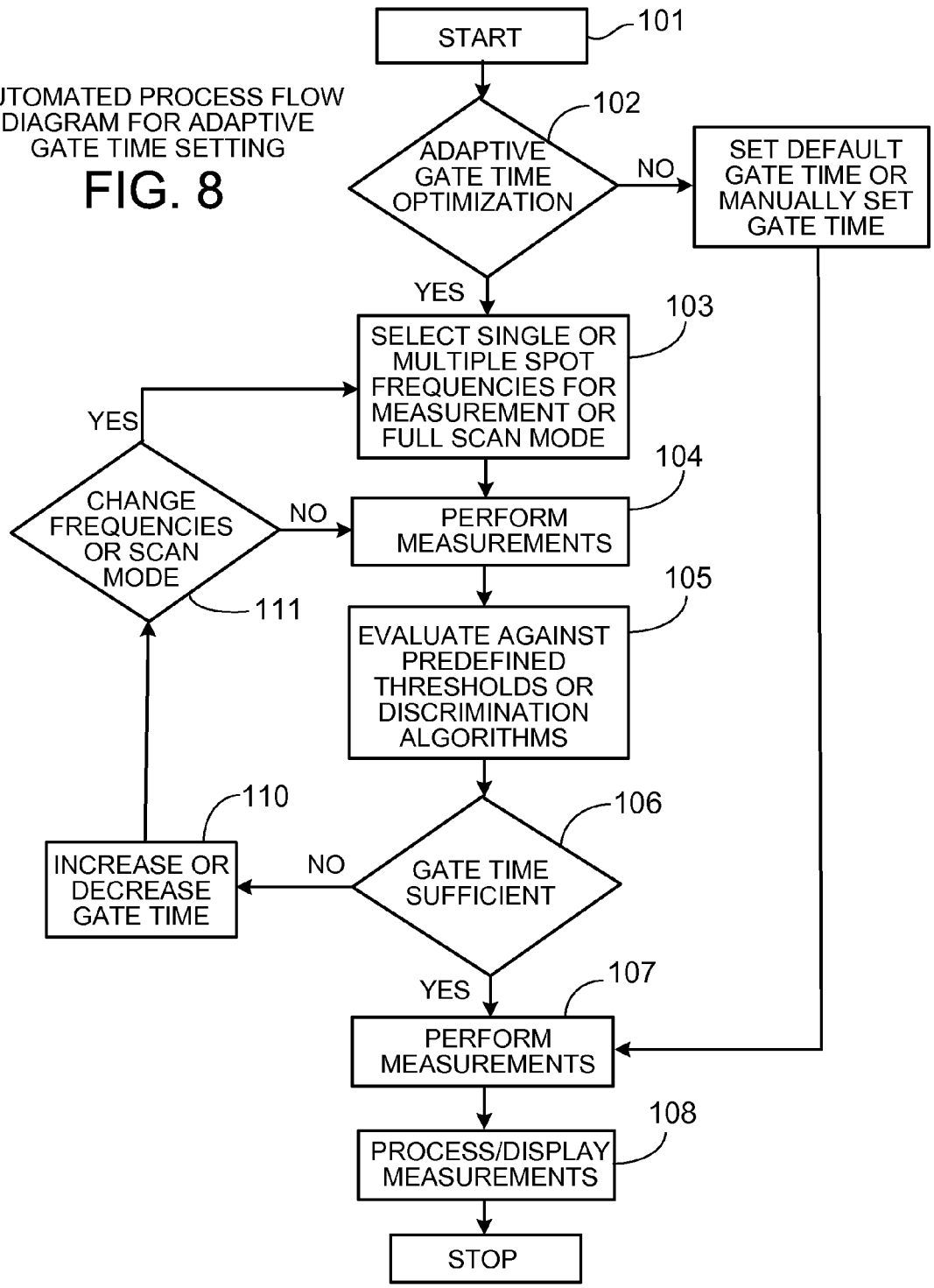

METHOD AND DEVICE FOR IMPROVED DETECTION AND ANALYSIS OF PARTIAL DISCHARGE ACTIVITY IN AND AROUND HIGH VOLTAGE ELECTRICAL EQUIPMENT

CROSS REFERENCE TO RELATED APPLICATIONS

This application is a U.S. National Phase Application under 35 U.S.C. 371 of International Application PCT/US2010/028416, filed on Mar. 24, 2010, which claims the benefit of U.S. Provisional Patent Application No. 61/163,721 filed Mar. 26, 2009, the entire contents of which are incorporated herein by references in their entireties.

The present invention relates in general to adaptive detection and discrimination of low repetition rate broadband impulsive emissions.

BACKGROUND OF THE INVENTION

For background reference is made to the following references:
CISPR 16-1-1, "Specification for Radio Disturbance and Immunity Measuring Apparatus and Methods—Part 1: Radio Disturbance and Immunity Measuring Apparatus" (1999).
S. Hashimoto and H. Misaizu, "Impulse Signal Detector", JP2000333213.
M. Hirose et al., "Device for Measuring the Average Value of Pulse Signals", U.S. Pat. No. 5,416,798.
T-S Kim et al., "Partial Discharge Measuring Method using Frequency Spectrum Analyser" KR100206662.
W. Schaefer, "Understanding Impulse bandwidth Specifications of EMI Receivers", IEEE International Symposium on EMC, pp. 958-961 (1999).
W. Schaefer, "Signal Detection with EMI Receivers", Conformity, pp. 12-22, July (2002).
W Schaefer, "Measurement of impulsive signals with a spectrum analyzer or EMI receivers", IEEE Int. Symposium on EMC, Vol. 1, pp. 267-271 (2005).
W. Schaefer, "Narrowband and broadband discrimination with a spectrum analyzer or EMI receiver", IEEE International Symposium on EMC, Vol. 2, August pp. 249-255 (2006).
W. Skudera Jr., "RF Pulse Detection", U.S. Pat. No. 5,561,364.
J. B. Taylor and M. K. Ellis, "Method and Apparatus for Distinguishing Narrowband Continuous Wave Signals from Broadband and Impulsive Signals", U.S. Pat. No. 5,065,334.
Tektronix Inc., "Wide-bandwidth spectrum analysis of transient signals using a real-time spectrum analyser", CN101300498.

SUMMARY OF THE INVENTION

According to the invention there is apparatus for processing broadband impulsive signals of low repetition rate including a tuner constructed and arranged to receive broadband impulsive signals of low repetition rate and provide an output signal characteristic of the amplitude and spectral content of the received input signal. A number of resolution bandwidth filters coupled to the tuner output each have a different bandwidth that determines the measurement resolution of the device and influences the sensitivity and transient response to low repetition rate impulsive signals with at least one radio frequency switch for selecting a resolution bandwidth filter for coupling to an associated one of at least a peak detector, an average detector and an envelope generator. A gate generator is coupled to the peak detector, the average detector and the envelope generator constructed and arranged to furnish a gating signal to the peak detector, the average detector and the envelope generator that enable the peak detector, the average detector and the envelope generator to provide a peak signal, an average signal and an envelope signal respectively during a selected gating interval. A microprocessor is coupled to the peak detector and the average detector constructed and arranged to process the outputs of the peak detector and the average detector and furnish frequency control signals to the tuner and gate control signals to the gate generator.

The tuner may comprise a first mixer, an RF input coupled to the first mixer for receiving an input signal, a voltage controlled oscillator coupled to the first mixer for combining with an RF input signal to provide first IF signal. A frequency synthesizer is coupled to the first voltage controlled oscillator. A band-pass filter couples the output of the first mixer to the input of a second mixer. A second voltage-controlled oscillator is coupled to the frequency synthesizer and to the second mixer for combining with the output of the first bandpass filter to provide a second IF signal. A second band-pass filter is coupled to the output of the second mixer and coupled to the tuner output.

There are at least three of the resolution bandpass filters coupled to the tuner output, a number of logarithmic amplifiers each connected to the output of a respective one of the resolution bandwidth filters, and a number of radio frequency switches each coupled to the output and input of a respective one of the logarithmic amplifiers. The peak detector, average detector and envelope generator are coupled to respective ones of the radio frequency switches.

Apparatus for processing broadband impulsive signals to pulsive signals of low repetition rate includes a tuner constructed and arranged to receive broadband impulsive signals of low repetition rate and provide an output signal characteristic of the amplitude and spectral content of the received input signal. A plurality of resolution bandwidth filters are coupled to the tuner output with each having a different bandwidth that determines the measurement resolution of the device and influences the sensitivity and transient response to low repletion rate impulsive signals. At least one radio frequency switch is constructed and arranged to select a resolution bandwidth filter for coupling to an associated one of at least a peak detector, an average detector and an envelope generator. A gate generator is coupled to the peak detector, the average detector and the envelope generator and constructed and arranged to furnish a gating signal to the peak detector, the average detector and the envelope generator that enables the peak detector, the average detector and the envelope generator to provide a peak signal, an average signal and an envelope signal respectively during a selected gating interval. A microprocessor is coupled to the peak detector and the average detector constructed and arranged to process the output of the peak detector and the average detector and furnish frequency control signals to the tuner and gate control signals to the gate generator.

The tuner may include a first mixer, an RF input coupled to the mixer for receiving an input signal. A voltage controlled oscillator may be coupled to the mixer for combining with the an RF input signal to provide an IF signal. A frequency synthesizer may be coupled to the first voltage controlled oscillator. A band passive filter may couple the output of the first mixer to the input of the second mixer. A second voltage controlled oscillator may be coupled to the frequency synthesizer and to the mixer for combining with the output of the first band pass filter to provide a second IF signal. A second band pass filter may be coupled to the output of the second mixer and coupled to the tuner output.

There may be at least three of the resolution bandwidth filters coupled to the tuner output. A plurality of logarithmic amplifiers each connected to the output of their respective one of the resolution bandwidth filters and a plurality of radio frequency switches each coupled to the output and input of a respective one of the log arrhythmic amplifiers. The peak detector, the average detector and the envelope generator are coupled to respective ones of the radio frequency switches.

It is an important object of the invention to provide improved detection and discrimination of low repetition rate broadband impulsive emissions.

Other features, objects and advantages of the invention will become apparent from the following detailed description when read in connection with the accompanying drawing in which:

BRIEF DESCRIPTION OF THE SEVERAL VIEWS OF THE DRAWING

FIG. 1 is a block diagram illustrating the logical arrangement of a tuner section in accordance with an embodiment of the invention;

FIG. 2 is a block diagram illustrating the logical arrangement of an RF detector section in accordance with an embodiment of the invention;

FIG. 8 is an automated process flow diagram for adaptive gate time setting in accordance with the invention.

DETAILED DESCRIPTION

Figure 3:
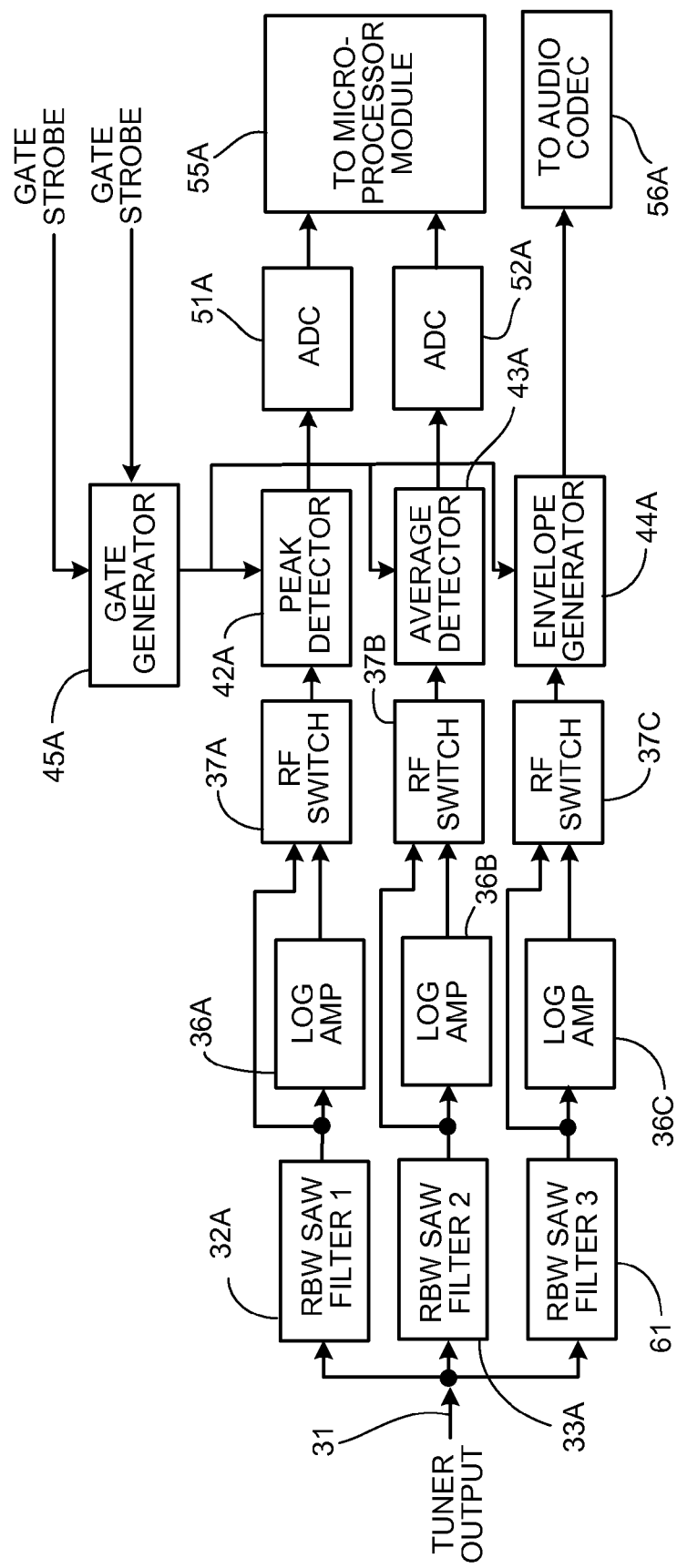
FIG. 3 is a block diagram of an alternative RF detector section in accordance with an embodiment of the invention.

With reference now to the drawing and more particularly FIG. 1 thereof, there is shown a block diagram illustrating the logical arrangement of a tuner section in accordance with an embodiment of the invention. An RF input signal is received on RF input 11 of low noise input amplifier 12 whose gain is controlled by a gain control signal on line 13. The output of low noise amplifier 12 is delivered to one input of mixer 14 that receives a local oscillator signal from voltage controlled oscillator 15 of a frequency determined by frequency synthesizer 16 whose frequency is controlled by a frequency sweep control signal on line 17. The output of mixer 14 is delivered to the input of the first IF amplifier 21 having a band pass filter whose output is delivered to second mixer 22 on one input that receives a local oscillator signal from voltage controlled oscillator 23 whose frequency is controlled by frequency synthesizer 16. The output of second mixer 22 is delivered to the input of amplifier 24 whose output is delivered to the second IF amplifier 25 having a band pass filter. The output of second IF amplifier 25 is delivered to the input of output amplifier 26 whose gain is controlled by the gain control signal on line 27 to provide the tuner output on line 31.

Referring to FIG. 2, there is shown a block diagram illustrating the logical arrangement of an RF detector section in accordance with an embodiment of the invention that receives the output signal from the tuner section on line 31 at the inputs of resolution bandwidth saw filter 32 and resolution bandwidth saw filter 33.

The outputs of RBW saw filters 32 and 33 are coupled to RF switch 34 that receives a selection signal on line 35 controlling the selection of one of the RBW filters for coupling to the input of log amp 36. The output of RE switch 34 is also coupled to log selection RF switch 37 which selects either the output of an RBW saw filter or the output of log amp 36 in response to the log selection signal on line 41. The output of the second RF switch 37 is delivered to peak detector 42, average detector 43 and envelope generator 44. Detectors 42 and 43 and envelope generator 44 are gated on to detect in response to a signal from gate generator 45 that receives a gate strobe signal on line 46 and a gate duration signal on line 47. The outputs of peak detector 42 and average detector 43 are coupled to analog-to-digital converters 51 and 52, respectively, to provide digital signals on lines 53 and 54 to microprocessor module 55. The output of envelope generator 45 is delivered to audio codec 56.

Microprocessor module 55 provides a selection signal on line 35 of RF switch 34 to select a particular RBW filter. While FIG. 2 shows two RBW filters, it may be advantageous to use more. The RBW filter determines the measurement resolution of the system and influences the sensitivity and transient response of the system to low repetition rate impulsive signals. Examples of RBW filter bandwidths are 6 MHz 1 MHz, 300 KHz and other suitable bandwidths.

The switchable logarithmic amplifier 36 provides an output which is the logarithm of the envelope of the received RF signal and can be switched out to provide linear detection by operation of the second RF switch 37.

Referring to FIG. 3, there is shown an alternate embodiment of the RF detector section having separate signal paths for each detector allowing the implementation of different and parallel combinations of RBW filters, logarithmic compression and detector type. A parallel signal path is implemented through one or more detectors from a set of peak, quasi-peak, average and root-square detectors. For this specific embodiment, peak and average detectors stand 43A are shown. The operation of the peak detector 42A and tracking of the peak amplitude of the envelope of the RF signal generated from the logarithmic amplifier 36C is controlled by the pulsed gate signal source from the gate pulse generator 45A. The voltage which represents the detected peak signal amplitude is held in the circuit while the gate pulse is not active and tracks the peak amplitude of the gate if the gate pulse is active. The average detector integrates the voltage signal from the logarithmic amplifier 36B over a precise time interval controlled by the gate pulse and set by the imbedded microprocessor module 55A.

A gate pulse generator 45A is strobed by the imbedded microprocessor module 55A and provides a precision gate pulse signal to control the operation of the detectors 42A and 43A. This pulse may be short or have pulse lengths of many hundreds milliseconds. The duration of the pulse is commanded by the imbedded microprocessor 55A based on measurement algorithms that facilitate automatic selection of adaptive gate times to increase sensitivity to impulsive signals as they are received or to fix user selectable gate times. This detector section is typically implemented by a micro controller circuit to allow the desired precision and jitter performance to maintain accuracy and consistency of measurement.

A set of analog-to-digital (ADC) channels and are 51A and 52A equal to the number of parallel detector signal paths are sampled synchronously or the equivalent to synchronous sampling. The architecture may be implemented by a multiplexed ADC. The architecture allows the peak and average measurement of the received RF signal at the same instant of time rather than within a given time frame. The interface to embedded microprocessor 55A may be either a parallel or serial interface.

Figure 4:
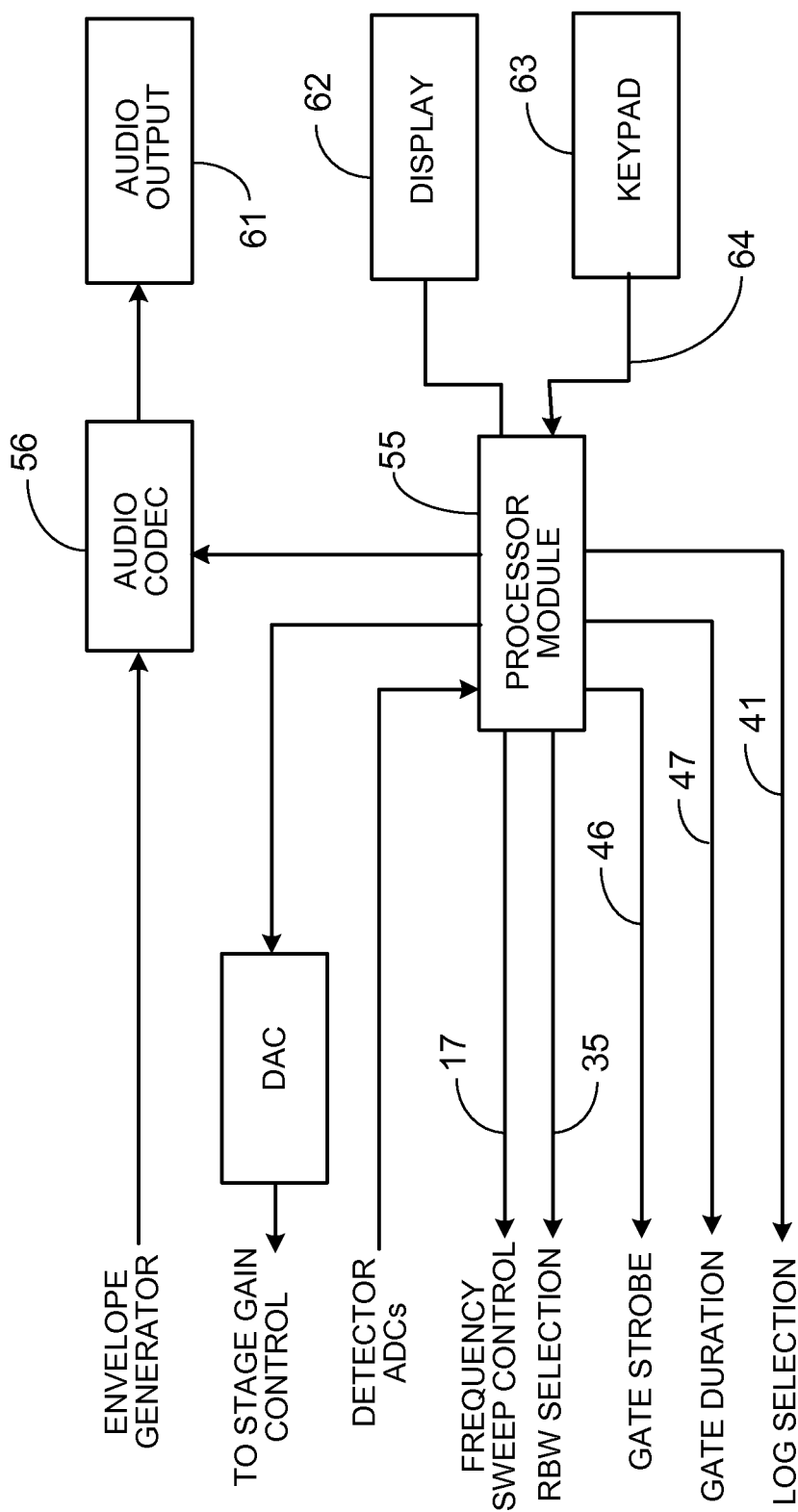
FIG. 4 is a block diagram illustrating the logical arrangement of a digital section in an embodiment of the invention.

An embedded digital section as shown in FIG. 4 provides the user interface, controlling the tuner and analog detection sections, digitizing and acquiring the detector outputs, processing the digitized signals, performing the evaluation of instrument set up against predefined threshold or discrimination algorithm, adapting instrument set up automatically and displaying the resulting traces. This embodiment includes imbedded microprocessor control module 55 that provides the frequency sweep control signal on line 17, the RBW selection signal on line 35, the gate strobe signal on line 46, the gate duration signal on line 47 and the log selection signal on line 41. Processor module 55 also controls audio codec 56 that provides an audio output on electroacoustical transducer 61. Processor module 55 also provides a video signal for display on the display 62 and receives manual control signals from keypad 63 on input line 64.

Figure 5:
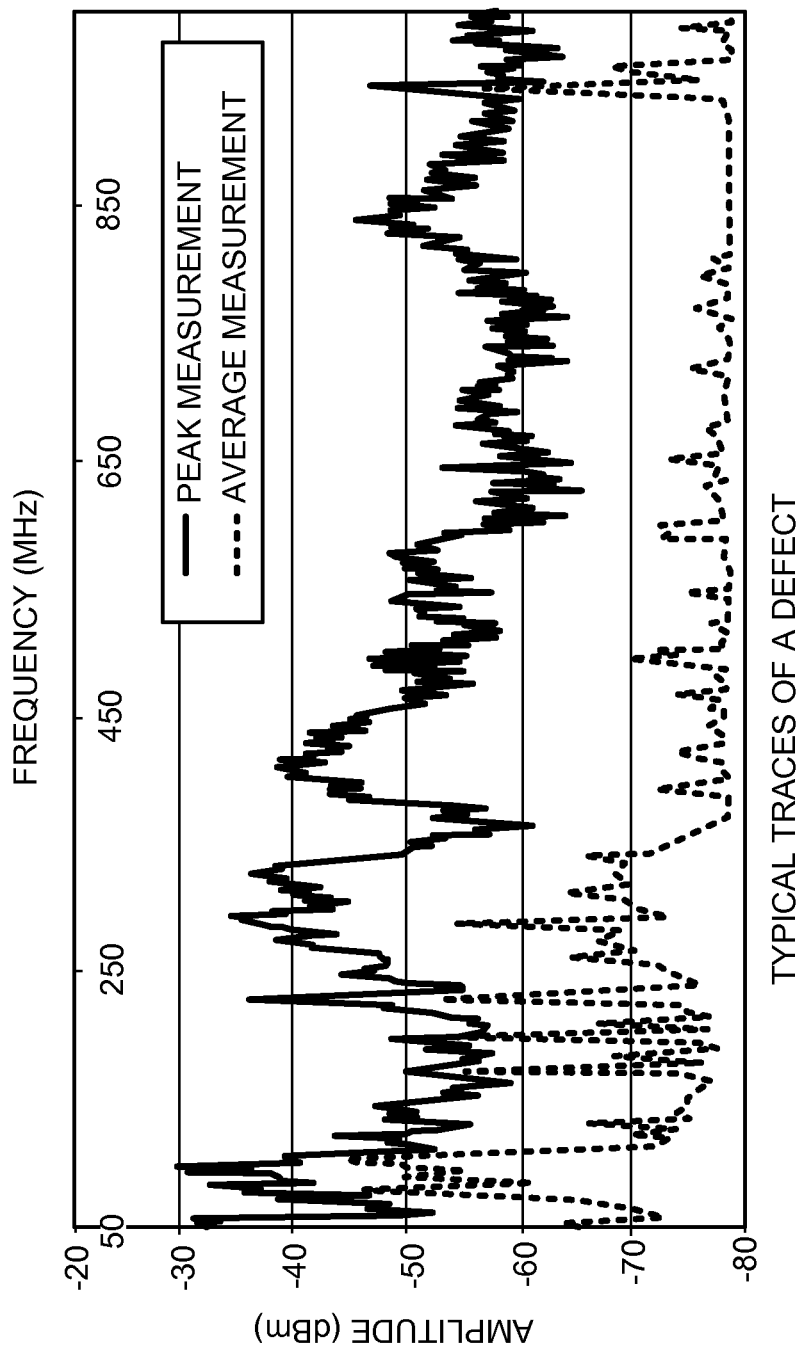
FIG. 5 is a graphical representation of amplitude as a function of frequency illustrating typical traces of a defect detected with an embodiment of the invention.
Figure 6:
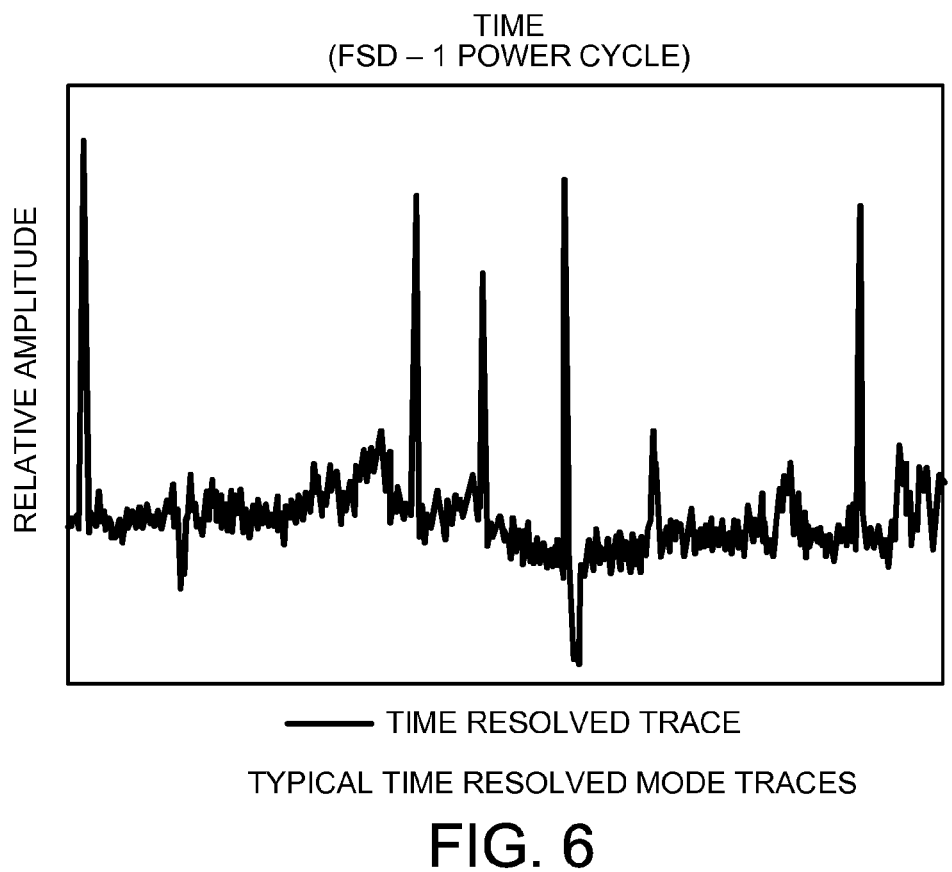
FIG. 6 is a graphical representation of a typical time resolved mode trace.
Figure 7:
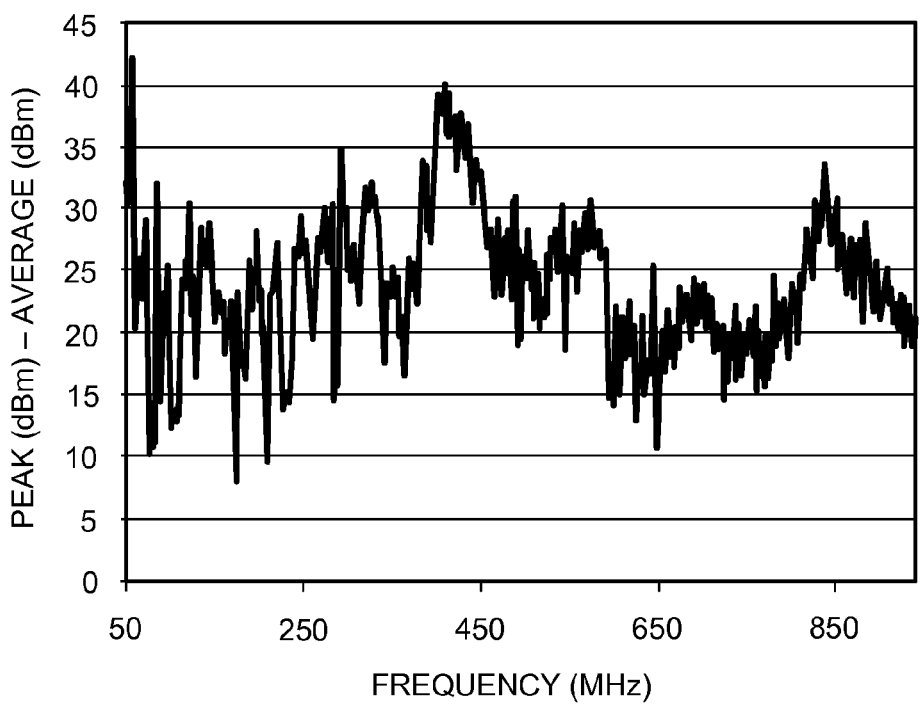
FIG. 7 is a graphical representation as a function of frequency of typical peak minus average measurements from a real defect.

Examples of the displayed outputs obtained from such an embodiment are shown in FIGS. 5-7. FIG. 5 shows for a preferred gate time the simultaneous peak and average detector values up to 1000 MHz when a high voltage partial discharge (PD) fault is present. The peak value provide significant levels of sensitivity in the presence of impulsive PD events and provides broadband characteristic patterns expected from intermittent impulsive events. The average values as a function of frequency are much lower than the peak values and indicate that the peak value signals derive from intermittent events and not from continuous signals. FIG. 6 shows the display the system is embodiment when switched into time resolved mode and displays the peak detected output at a single spot frequency over one power cycle. The peak values are evident and demonstrate that the signals are impulsive in nature, intermittent and much larger than any continuous background signals which exist. FIG. 7 is a graphical representation of the peak-minus measurement from a real defect average as a function of frequency and provides a quantification of the specific broadband nature of the low repetition rate intermittent signals.

Referring to FIG. 8, there is shown a flow chart outlining the steps for optimizing the gate time for peak and average measurements. At the beginning of the optimization process at start step 101 a decision can be taken to automate an adaptive gate time process in step 102 or choose a default or user specified gate time. If the automated process is selected, then an initial gate time is selected in step 103 followed by a choice of single or multiple spot frequencies for measurement or a full frequency scan is selected. Measurements are undertaken in step 104 using the initial gate time. After measurement decisions based on parameters, such as repetition rate, average, peak, bandwidth, or algorithm outputs based on measured or discrimination parameters are performed in step 105. Depending on the optimization decisions, if the gate time is evaluated as optimized, then the system is set in step 106, and the measurement and processing and display processes are performed to make assessment of the signals in steps 107 and 108.

If the gate time is not optimized in step 106, then depending on the algorithms and decision processes, the gate time can be increased or decreased appropriately in step 110. The system may also choose to alter appropriately the single or multiple spot frequencies or frequency scan used in the optimization process at this stage in step 111 before returning for measurements and evaluating the measurements for optimization. The process continues until an optimized gate time is chosen. If no optimized gate time can be found after a number of evaluations, the user will be informed and set a default gate time for measurements. The entire process can be initiated at any time, either by user control or automatic initiation based on other measured parameter thresholds or alarms as required.

The invention has a number of advantages. It optimizes or maximizes low repetition rate impulsive signals for measurement in both frequency scan and time modes. Although the frequency scan occurs digitally, the detector implementations are analog to allow the system to be implemented as a hand held instrument that is a more practical realization for deployment in the field in a relatively inexpensive physical package. Employing a manual or user controlled gate time accentuates the measurement of low repetition rate impulsive broadband energy signals. Thus, the time overage peak and average detectors operate by a deterministic user defined spot frequency measurement time. The invention also accentuates the measurement of low repetition rate impulsive broadband energy with an automated adaptive gate time process. An embedded microprocessor commands the duration of the gate pulse based on measurement repetition rate algorithms or threshold algorithms that facilitate automatic selection of adaptive gate times to increase sensitivity to impulsive signals as they are received. Thus the invention optimizes the gate time based on the measured repetition rate signals and their associated strength to allow relatively unskilled personnel to make the measurements.

The invention simultaneously provides synchronized sampling of the output of a selection of multiple detectors which may possess different band pass filters to allow a simultaneous display to the user of real-time measurements of the peak and average values as well as other general envelope detection methods at each frequency over the same measurement gate time. Envelope detection allows an audio output to exist to discriminate orally, if impulsive signals from continuous signals.

The invention features a user switched mode between frequency spectrum mode and time resolved mode presentations at any user selected or automated spot frequency as a function of time that can be arbitrarily chosen, set to the power cycle, or chosen as a function of the automated adaptive gate time.

The invention provides the ability to measure and display a number of integrative parameters, such as repetition rate, peak amplitude, average amplitude and amplitude distribution for a spot frequency over a user selected or automated adaptive gate time. The invention provides the ability to measure and display multiple time resolved presentations based on multiple selected spot frequencies which are measured.

The invention provides different presentation frequency mode views of the measurements to facilitate improved interpretation and discrimination of the existence of low repetition rate impulsive PD signals and continuous signals. For example (peak-average) (which represents the peak average power ratio—PAPR if the signals are in dB or dBM) at each frequency across the range of frequencies, allowing the existence of broadband low repetition signals to be accentuated and discriminated from continuous signals and presented and stored for reference. If no broadband impulsive signals exist, it will give a measure of the peak value in relation to the average of any background signals and will be representative of an environment with no impulsive signals present.

(Peak-stored average) at each frequency to allow comparison with stored average values such as a baseline background measurement or a remote background measurement from the system or when the system under measurement is not active or powered.

(Average-stored average) to allow an evaluation of any increased repetition rate energy to be determined. To allow determination and quantification that the impulsive signals have increased the average power due to increased repetition rate but that the peak value may not have changed.

(Peak-stored peak) at each frequency to allow comparison of previous peak values and thus facilitating peak trending of the peak repetition rate energy with time.

The integrated area of the (Peak-average) or (Peak-stored average) to be compared to allow a general measure of the energy within the impulsive signals to be trended.

The presentation of the information to the user through displaying thresholds related to the parameters derived from steps above. This presentation may include for example, coloring of displays to provide alarms which indicate situations of high repetition rate, changes in displays or large energy detection.

The invention is embodied in the PDS-100 RFI surveying tool commercially available from Doble Lemke, Kaiserstrasse 9, 4310, Rheinfelden, Switzerland available from HV Technologies, Inc., 8515 Rixlew Lane, P.O. Box 1630, 20110 Manassas, Va., USA. Incorporated by reference herein.

There has been described novel apparatus and techniques for adaptive detection and discrimination of low repetition rate broadband impulsive emissions. It is evident that those skilled in the art may now make numerous uses and modifications of and departures from the specific apparatus and techniques herein disclosed without departing from the inventive concepts. Consequently the invention is to be construed as embracing each and every novel feature and novel combination of features present in or possessed by the apparatus and techniques herein disclosed and limited solely by the spirit and scope of the appended claims.

What is claimed is:

1. Apparatus for the processing broadband impulsive signals of low repetition rate comprising,
    a tuner constructed and arranged to receive broadband impulsive signals of low repetition rate and provide an output signal characteristic of the amplitude and spectral content of the received input signal,
    a plurality of resolution bandwidth filters coupled to the tuner output each having a different bandwidth that determines the measurement resolution of the device and influences the sensitivity and transient response to low repetition rate impulsive signals,
    at least one radio frequency switch for selecting a resolution bandwidth filter for coupling to an associated one of at least a peak detector, an average detector and an envelope generator,
    a gate generator coupled to the peak detector, the average detector and the envelope generator constructed and arranged to furnish a gating signal to the peak detector, the average detector and the envelope generator that enables the peak detector, the average detector and the envelope generator to provide a peak signal, an average signal and an envelope signal respectively during a selected gating interval,
    a microprocessor coupled to the peak detector and the average detector constructed and arranged to process the outputs of the peak detector and the average detector and furnish frequency control signals to the tuner and gate control signals to the gate generator.

2. Apparatus for the processing of broadband impulse signals of low repetition rate of in accordance with claim 1, wherein the tuner comprises,
    a first mixer,
    an RF input coupled to the mixer for receiving an input signal,
    a voltage controlled oscillator coupled to the mixer for combining with an RF input signal to provide an IF signal,
    a frequency synthesizer coupled to the first voltage control oscillator,
    a bandpass filter coupling the output of the first mixer to the input of a second mixer,
    a second voltage control oscillator coupled to the frequency synthesizer and
    to the mixer for combing with the output of the first band pass filter to provide a second IF signal,
    a second end pass filter coupled to the output of the second mixer and coupled to the tuner output.

3. Apparatus for the processing of broad band impulse signals of low repetition rate in accordance with claim 1 and further comprising
    at least three of said resolution bandwidth filters coupled to the tuner output,
    a plurality of log arithmetic amplifiers each connected to the output of a respective one of said resolution bandwidth filters,
    a plurality of said radio frequency switches each coupled to the output and input of a respective one of said log arrhythmic amplifiers,
    said peak detector, said average detector and said envelope generator coupled to respective ones of said radio frequency switched.

4. Apparatus for the processing of broadband impulse signals of low repetition rate in accordance with claim 1 wherein there are first and second resolution bandwidth filters coupled to the tuner output and a radio frequency switch for selecting a resolution bandwidth filter for coupling to a logarithmic amplifier and a second radio frequency switch for selectively connecting one of the input and output of the logarithmic amplifier to the peak detector, average detector and envelope generator.

5. Apparatus for the processing of broadband impulse signals of low repetition rate in accordance with claim 4 and further comprising, peak and average analog-to-digital converters for coupling the outputs of the peak detector and average detector respectively to the microprocessor and converting the analog signals on the peak detector and average detector outputs to corresponding digital signals.

6. Apparatus for the processing of broadband impulse signals of low repetition rate in accordance with claim 4 and further comprising an audio codec coupling the output of the envelope generator to an audio codec.

7. A method of processing broadband impulse signals of low repetition rate, including,
    receiving with a tuner broadband impulsive signals of low repetition rate,
    providing from the tuner an output signal characteristic of the amplitude and spectral content of the received input signal,
    filtering the latter output signal with a plurality of resolution bandwidth filters each having a different bandwidth to determine the measurement resolution of the device and influence the sensitivity and transient response to low repetition rate impulsive signals,
    selecting a resolution bandwidth filter with a radio frequency switch and coupling the selected resolution bandwidth filter to an associated one of at least a peak detector, an average detector and an envelope generator, enabling at least one of the peak detector, average detector and envelope generator for a predetermined gating interval to provide at least one of a peak signal, an average signal and an envelope signal, and processing the outputs of at least one of the peak detector and the average detector with a microprocessor.

8. A method for processing broadband impulse signals of low repetition rate in accordance with claim 7 and further comprising, furnishing frequency control signals and gate control signals for controlling the frequency of the tuner to the received input signal and the interval in which the at least one of the peak detector and average detector is enabled.

* * * * *